United States Patent

Ohashi et al.

[11] Patent Number: 5,864,275
[45] Date of Patent: Jan. 26, 1999

[54] OPPOSED MAGNET-TYPE MAGNETIC CIRCUIT ASSEMBLY WITH PERMANENT MAGNETS

[75] Inventors: Ken Ohashi; Yuhito Yoneda; Koji Miyata, all of Fukui-ken; Yuji Inoue, Tokyo, all of Japan

[73] Assignees: Shin-Etsu Chemical Co., Ltd; GE Yokogawa Medical Systems, Ltd., both of Tokyo, Japan

[21] Appl. No.: 703,450

[22] Filed: Aug. 27, 1996

[30] Foreign Application Priority Data

Aug. 28, 1995 [JP] Japan .................................. 7-218544
Aug. 28, 1995 [JP] Japan .................................. 7-218549

[51] Int. Cl.⁶ .................................................. G01R 33/20
[52] U.S. Cl. ...................... 335/306; 335/297; 335/298; 335/296; 324/319
[58] Field of Search .................... 335/296–306; 324/318–320

[56] References Cited

U.S. PATENT DOCUMENTS

| | | | |
|---|---|---|---|
| 4,943,774 | 7/1990 | Breneman et al. | 324/318 |
| 5,089,798 | 2/1992 | Miyata | 335/211 |
| 5,194,810 | 3/1993 | Breneman et al. | 324/319 |
| 5,229,723 | 7/1993 | Sakurai et al. | 324/319 |
| 5,583,439 | 12/1996 | Danby et al. | 324/318 |
| 5,754,085 | 5/1998 | Danby et al. | 335/297 |

FOREIGN PATENT DOCUMENTS 619 499  10/1994  European Pat. Off. .
60-8893  3/1994  Japan .

*Primary Examiner*—Michael L. Gellner
*Assistant Examiner*—Raymond M. Barrera
*Attorney, Agent, or Firm*—Wenderoth, Lind & Ponack

[57] ABSTRACT

Proposed is an improvement in an opposed-magnet magnetic circuit assembly with permanent magnets suitable for use, for example, in an MRI instrument comprising a pair of upper and lower permanent magnets to form a magnetic-field gap space therebetween, a pair of magnetic-field adjustment plates each on the surface of the permanent magnet to face the gap space and a pair of back yokes each on the back surface of the permanent magnet. According to the first aspect of the invention, a combination of a gradient coil and a shimming plate is mounted on the magnetic-field adjustment plate with intervention of several pieces of shim members and, further, another set of second shim members are bonded to the surface of the shimming plate facing the gap space with an object to improve the uniformity of the magnetic field in the gap space. According to the second aspect of the invention, which is directed to the problem of alleviation of the oppressive sense received by the patient lying in the MRI instrument due to his encaved condition, the back yokes are magnetically and mechanically connected with two and only two columnar connecting yokes each of which has a smaller cross section in the center portion than in the upper and lower end portions in order to ensure lateral openness on both sides of the patient. Preferable configurations are also proposed for the back yokes and the permanent magnets.

2 Claims, 4 Drawing Sheets

OPPOSED MAGNET-TYPE MAGNETIC CIRCUIT ASSEMBLY WITH PERMANENT MAGNETS

BACKGROUND OF THE INVENTION

The present invention relates to an improvement in an opposed magnet-type magnetic circuit assembly with permanent magnets or, more particularly, relates to an improvement in an opposed magnet-type magnetic circuit assembly with permanent magnets having usefulness for generating a magnetic field of high uniformity required in various kinds of precision magnetic instruments such as NMR, ESR and MRI instruments in which uniformity of the magnetic field within a relatively large space is essential.

Several types of magnetic circuit assemblies with permanent magnets have been heretofore proposed and now under practical applications, for example, in permanent magnet MRI instruments with an object to obtain a highly uniform magnetic field within a large space. One of the most conventional types is the so-called dipole-ring magnetic circuit assembly illustrated in FIG. 1 by a perspective view. The main part of the magnetic circuit assembly is a tubular assembly 1 consisting of a plural number of segment magnets 1A to 1H arranged in a tubular arrangement, each having a direction of magnetization indicated on the end surfaces of the segment magnets 1A to 1H by the respective arrows, the directions rotating twice starting with the segment magnets 1A and ending with 1H in a counterclockwise circulation on the figure. The name of the "dipole-ring" magnetic circuit is given in view of the appearance of the magnetic charges of N and S on the inward surface of the tubular assembly 1 in the revolution of the magnetization direction. As a synthesis of the magnetic fields generated by the respective segment magnets 1A to 1H, a magnetic field indicated by the arrow H is generated in the space surrounded by the tubular arrangement of the segment magnets 1A to 1H. The uniformity of the magnetic field H can be high enough provided that the tubular assembly 1 of the segment magnets 1A to 1H is sufficiently long. Adjustment of the magnetic field H can be performed by the displacement of the respective segment magnets 1A to 1H in the radial directions or modification of the inclination thereof in the axial directions.

The magnetic circuit assembly of this type is described, for example, by K. Halbach in Nuclear Instruments and Methods, volume 169 (1980), page 1 and MRI instruments utilizing a magnetic circuit assembly of this type are disclosed in U.S. Pat. No. 4,580,098 and Japanese Patent Kokai 62-104011.

Since no yokes are required outside of the tubular magnet assembly 1 to serve as a pathway of the magnetic flux, the dipolering magnetic circuit assembly has advantages, as compared with magnetic circuit assemblies of other types using yokes, that the overall weight of the magnetic circuit assembly can be relatively small and the upper limit of the magnetic field obtained therein can be high. The advantage of the smaller overall weight, however, is exhibited only when the magnetic field to be generated therein is considerably high because, when the magnetic field required is only about 3000 Oe or lower, the total weight of the segment magnets can not always be smaller than in the magnetic circuit assemblies of other types. This is the reason for the relatively small number of cases where magnetic circuit assemblies of this type are used in a practical application.

Another type of the magnetic circuit assembly widely used in the above mentioned applications is an opposed-magnet magnetic circuit assembly illustrated in FIG. 2A by an axial cross sectional view and in FIG. 2B by a horizontal cross sectional view as cut and viewed in the direction indicated by the arrows IIB—IIB in FIG. 2A. Magnetic circuit assemblies of this type are disclosed, for example, in WO84/00611 (PCT/US 83/01175), Japanese Utility Model Publications 2-44483, 2-44484, 2-44485 and 2-44486, Eizo Joho (Imaging Information), volume 15 (1983), page 379, Byotai Seiri (Disease Physiology), volume 4 (1985), page 91 and elsewhere. Almost all of the permanent-magnet MRI instruments currently running are built with a magnetic circuit assembly of this type.

Following is a brief description of the general structure of the opposed-magnet magnetic circuit assembly.

An upper magnet 14A and lower magnet 14B are respectively mounted on the lower surface of the upper back yoke 10A and on the upper surface of the lower back yoke 10B in a coaxial disposition directing the S-pole and N-pole, respectively, toward the magnet gap to generate a magnetic field therein. A field-adjustment plate 16A or 16B made from a magnetic material is mounted on the surface of the magnet 14A or 14B, respectively, facing the gap space with an object to improve the uniformity of the magnetic field generated in the gap space between the magnets 14A and 14B. The field-adjustment plates 16A and 16B each have an axially symmetrical configuration or in the form of a disk in this case, in most cases, with modifications of the configuration in an object to further enhance the uniformity of the magnetic field in the gap space. As a typical modification in this regard, for example, the field-adjustment plates 16A and 16B each have a circular projection 161A or 161B called "a rose shim" protruded ringwise along the periphery of the flat body of the field-adjustment plate 16A or 16B, respectively.

Two combinations each consisting of the back yoke 10A or 10B, permanent magnet 14A or 14B and field-adjustment plate 16A or 16B, respectively disposed up and down symmetrically are magnetically connected with four columnar yokes 12A, 12B, 12C and 12D to form a closed magnetic circuit. Further, gradient coils 18A, 18B are each mounted on the surface of the field-adjustment plate 16A or 16B surrounded by the circular projection or first shim 161A or 161B. The height of the gradient coils 18A and 18B is such that the surface thereof facing the gap space is approximately coplanar with the outer surface of the circular projections 161A and 161B.

It is usual in the opposed-magnet magnetic circuit assembly that evaluation of the uniformity of the magnetic field in the gap space is undertaken in terms of the distribution of the magnetic field within an imaginary space at the center portion of the gap space having an spherical or ellipsoidal extension, which is referred to as the evaluation space hereinafter. When the field-adjustment plates are each a simple disk without the circular projection, the magnetic field in the equatorial portion of the evaluation space is smaller than in the polar portions thereof while, when the field-adjustment plate is provided with the circular projection as is illustrated in FIGS. 2A and 2B, the magnetic field in the equatorial portion of the evaluation space is increased due to the geometrical proximity of the equatorial portion to the surfaces of the upper and lower circular projections 161A and 161B so that the uniformity of the magnetic field throughout the evaluation space can be improved. A further proposal has been made to provide, in addition to the peripheral circular projections 161A and 161B, a plural number of circular projections having a smaller cross sectional profile than the peripheral ones on each of the bottom surfaces 162A and 162B of the field-adjustment plates 16A and 16B, respectively. As is understood from the above given description, the configuration of the field-adjustment plates is a very important factor having influences on the uniformity of the magnetic field within the evaluation space.

While it is indispensable in the opposed-magnet magnetic circuit assembly that the upper and lower back yokes 10A and 10B are connected by a plural number of connecting yokes which serve to form a closed magnetic circuit by leading the magnetic fluxes generated by the upper and lower permanent magnets 14A, 14B, the form and number of such connecting yokes can be different depending on the particular design of the magnetic circuit assembly. For example, each of the connecting iron yokes is in a columnar form and the number thereof is two or, as is illustrated in FIGS. 2A and 2B, four or in the form of a plate and the number thereof is two. Opposed-magnet magnetic circuit assemblies are mostly constructed by using four columnar connecting yokes in view of the easiness in the magnetic field adjustment and easiness in the assemblage works of the magnetic circuit assembly as is disclosed in Japanese Utility Model Publication 2-44483. The magnetic field in the evaluation space in the axial direction, i.e. in the direction of the columnar connecting yokes, is decreased as a trend because the magnetic fluxes are attracted by the columnar yokes. With an object to compensate this decrease in the magnetic field, a proposal has been made to provide a shunt yoke for shortcircuiting of magnetic fluxes in the direction of the opening so as to decrease the magnetic field in the direction of the opening.

It is a usual practice that a magnetic circuit assembly is designed by the method of numerical analysis taking into account a combination of the above described various factors so as to enable generation of a magnetic field of high uniformity within the evaluation space. It is, however, rather rare that, even if a magnetic circuit assembly could be designed so as to enable generation of a magnetic field of high uniformity, a magnetic field having uniformity of as high as designed can be obtained in an actual magnetic circuit assembly constructed according to the design. Rather, the uniformity of the magnetic field is usually subject to a great decrease as compared with the uniformity as designed as a consequence of overlapping of the unavoidable variations in the magnetic characteristics of the permanent magnets and errors in the mechanical working of the various members and assemblage of the members. Accordingly, a procedure of magnetic-field adjustment is indispensable after completion of the assemblage of the parts into a magnetic circuit assembly in order to obtain a highest possible uniformity of the magnetic field in the evaluation space.

The above mentioned magnetic field adjustment is performed in two levels of coarse adjustment by mechanical shimming and fine adjustment by magnetic-material shimming. The mechanical shimming is performed by the adjustment of the inclination of the back yokes, adjustment of the position of the field-adjustment plates, adjustment of the shunt yokes, insertion of a magnetic piece into the back yokes and so on. In the magnetic-material shimming, the uniformity of the magnetic field is improved by bonding magnetic pieces of varied volumes to appropriate spots on the field-adjustment plate or on a shim plate installed independently from the field-adjustment plates.

The magnetic materials used in the above mentioned magnetic-material shimming include soft magnetic materials such as iron and iron-based alloys, nickel and nickel-based alloys, amorphous magnetic materials and the like and hard magnetic materials such as hard ferrite magnets, rare earth-based magnets and the like as well as bonded magnets thereof. These magnetic materials are used in the form of a chip or in the form of a thin plate.

The magnetic field adjustment by shimming with a soft magnetic material encounters a difficulty when a plurality of the magnetic pieces are laid one on the other because no linear relationship is held between the number of the pieces and the amount of magnetic field adjustment. This difficulty is particularly great when the amount of magnetic field adjustment is large. This method, however, is advantageous in respect of the precision of fine adjustment because very small chips and thin plates or sheets can be readily prepared from a soft magnetic material.

On the other hand, the method of shimming with a magnet material is advantageous in respect of easiness of adjustment because a linear relationship is held between the number of the shimming members and the amount of magnetic field adjustment although the method is not suitable for precise and fine adjustment of the magnetic field because difficulties are encountered in the preparation of very small chips or thin plates of the magnetic material.

It would be an idea to employ the above described two different types of shimming materials in order to fully utilize the respective characteristics of the different materials. This approach of combined use of different types of shimming materials, however, has another problem prohibiting actual application thereof in the conventional shimming adjustment because the magnetic fluxes generated in the magnet materials influence on the soft magnetic material to destroy the linearity of the magnet. This is one of the important problems to be solved in the adjustment to establish uniformity of the magnetic field in a magnetic circuit assembly.

As is mentioned before, the opposed-magnet magnetic circuit assembly is constructed by connecting the upper and lower back yokes with four columnar connecting yokes. The magnetic circuit assembly of this type is advantageous in respect of the high efficiency with little leakage of the magnetic fluxes because the magnetic flux emitted in one of the upper and lower permanent magnets is led efficiently to the opposite pole of the other permanent magnet through the yokes.

It is therefore important in order to improve the efficiency of the magnetic circuit that the leakage of magnetic fluxes is minimized from the yokes. This requirement is of course satisfied when the yokes have a large cross sectional area sufficient to lead all of the magnetic fluxes so as not to cause magnetic saturation within the yokes although this approach is under limitations by the necessary increase in the overall weight of the magnetic circuit assembly. In addition, the opposed-magnet magnetic circuit assembly works with a high working efficiency of the magnetic circuit when the magnetic field to be obtained in the gap space is approximately in the range from 1000 Oe to 2000 Oe from the standpoint of the working point of permanent magnets. Although an opposed-magnet magnetic circuit assembly capable of generating a magnetic field of 3000 Oe or higher has been developed, such an assembly is not always very satisfactory in respect of the utilization efficiency of the permanent magnets.

A further problem in the opposed-magnet magnetic circuit assembly relative to the efficiency of the magnetic circuit is leakage of the magnetic flux from the field-adjustment plates to the yokes. This is a phenomenon that the magnetic flux, which should be led from one of the-field-adjustment plates to the other field-adjustment plate through the gap space is partly lost by leakage to the yokes resulting in a decrease in the magnetic efficiency. Although this problem can be solved at least partly by increasing the distance between the respective permanent magnets and the yokes, this means is not practical due to the necessary increase in the iron weight.

An opposed-magnet magnetic circuit assembly has a further problem, in common with the magnetic circuit assemblies of other types such as those of the superconductivity magnet-type and dipole ring magnet-type, when an MRI instrument is constructed with the magnetic circuit assembly built therein and a patient lies in the magnetic field surrounded by the magnetic circuit assembly, namely, the patient more or less receives a sense of oppression and feels unpleasantness of entering a narrow cave even if he is not claustrophobic because the space in which the patient is lying is not open on both sides of the patient. This problem of claustrophobism can be partly alleviated in the opposed-magnet magnetic circuit assembly by increasing the transverse width of the assembly and increasing the distance between the permanent magnets and the yokes though accompanied by a disadvantage due to the increase in the weight of the yokes. This problem in the dipole ringmagnet magnetic circuit assembly can be alleviated only by increasing the inner diameter of the ringwise assembly of the segment magnets while such a means is absolutely impractical because the overall weight of the segment magnets increases at a rate proportional to the square of the diameter if not to-mention the further increase of the weight of the magnets because the length of the magnets in the axial direction also must be increased in order to ensure the necessary uniformity in the magnetic field.

The encaved condition of the patient lying in an MRI instrument has another problem that accessibility of a medical engineer to the patient is necessarily restricted and visual monitoring of the patient from outside is disturbed thereby although monitoring of the patient is usually conducted by a television system in which, however, the field of vision is very limited and the contrast of the image reproduced on the screen is usually not high enough necessitating direct visual monitoring. This problem, of course, can be solved at least partly by enlarging the space in which the patient is lying while such a means cannot be undertaken without being accompanied by a great disadvantage due to the increase in the overall weight of the yokes and magnets as is discussed in Nippon Rinsho (Japan Clinics), volume 41 (1983), page 254. Accordingly, it is eagerly desired to develop a permanent-magnet magnetic circuit assembly of high magnetic efficiency by which the oppressive sense which the patient receives when he is lying in an MRI instrument can be alleviated and the accessibility of medical engineers to the patient is ensured without a substantial increase in the weights of the yokes and magnets.

SUMMARY OF THE INVENTION

The present invention accordingly has an object to provide an improvement in an opposed-magnet permanent-magnet magnetic circuit assembly, by which the above described various problems and disadvantages in the prior art magnetic circuit assemblies can be solved and overcome.

Thus, in a first aspect of the invention, the present invention provides an improvement, in an opposed-magnet permanent-magnet magnetic circuit assembly comprising a pair of permanent magnets oppositely facing up and down each to the other keeping a magnetic-field gap space therebetween, a pair of field-adjustment plates each consisting of a flat disk and a circular projection along the periphery of the flat disk and mounted on the surface of the permanent magnet to face the magnetic-field gap space, a pair of combinations of a gradient coil and a shimming plate each mounted below or above the flat disk of the field-adjustment plate keeping a space therewith and a set of yokes magnetically connecting the permanent magnets to form a closed magnetic circuit, which improvement comprises:

(a) bonding at least one piece of a magnet or a magnetic material to the surface of the flat disk of each of the field-adjustment plates;

(b) mounting each of the shimming plates on the surface of the gradient coil to face the magnetic-field gap space; and (c) bonding at least one piece of a magnet or a magnetic material to the surface of the shimming plate facing the magnetic-field gap space.

In the above described improvement in the opposed-magnet magnetic circuit assembly with permanent magnets, the magnetic pieces (a) and (c) bonded to the respective field-adjustment plates and to the shimming plates, respectively, serve for the adjustment of the magnetic field and the numbers, amounts and positions thereof are selected by means of the method of linear programming.

In a second aspect of the invention, furthermore, the present invention provides an improvement, in an opposed-magnet magnetic circuit assembly comprising a pair of permanent magnets in the form of a plate oppositely facing up and down each to the other keeping a magnetic-field gap space therebetween, a pair of field-adjustment plates mounted on the surface of the permanent magnet to face the magnetic-field gap space, a pair of back yokes each mounted on the surface of the permanent magnet opposite to the magnetic-field gap space and a set of connecting yokes magnetically connecting the back yokes to form a closed magnetic circuit, which improvement comprises:

(a) having two and only two connecting yokes oppositely facing each to the other, of which the cross section in the center portion is smaller than the cross section in the upper and lower end portions;

(b) having each of the back yokes in the form of a generally polygonal plate having at least six corners; and (c) having each of the permanent magnets in the form of a plate, of which the aspect ratio is in the range from 0.5 to 2.

It should be noted that the cross section of each of the connecting yokes in the center portion thereof, which is smaller than the cross section in the upper and lower end portions, should be sufficiently large to lead the magnetic fluxes generated by the permanent magnets such that the leakage flux on the surface of the yokes does not exceed 10 G.

DETAILED DESCRIPTION OF THE PREFERRED EMBODIMENTS

As is described above, the present invention provides an improvement in an opposed-magnet magnetic circuit assembly with permanent magnets in two different aspects, of which detailed descriptions are given in the following.

Figure 1:
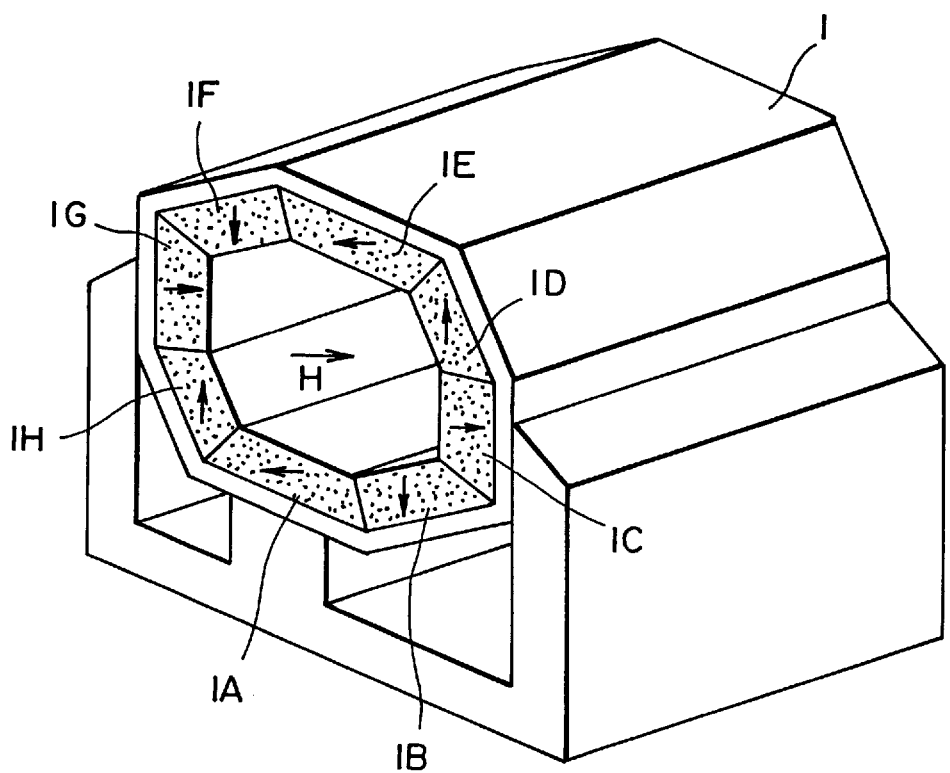
FIG. 1 is a perspective view of a dipole-ring magnetic circuit assembly in the prior art.
Figure 2A:
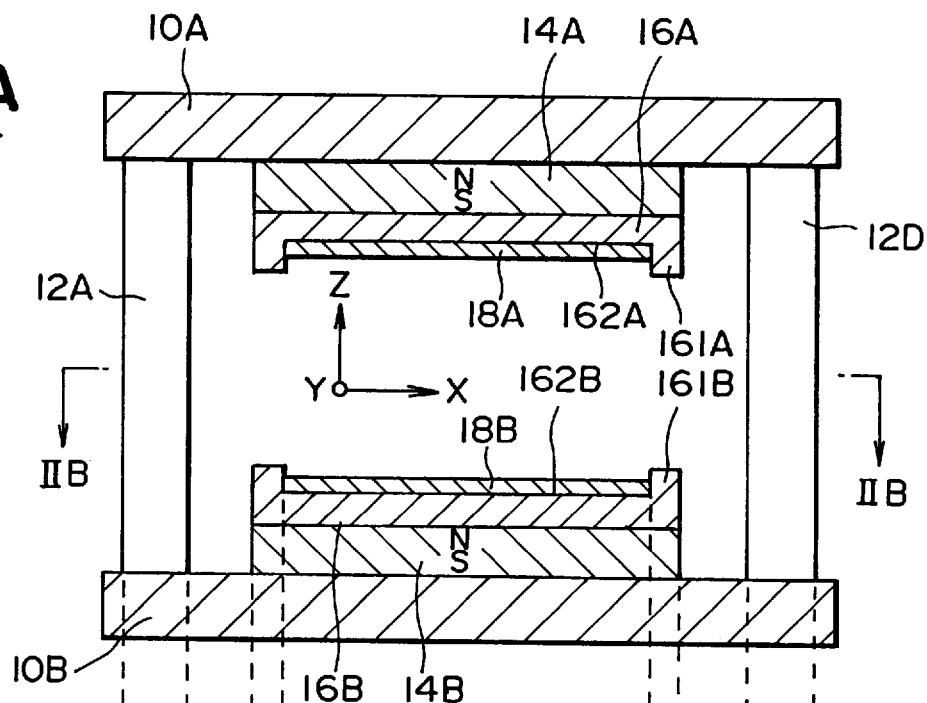
FIGS. 2A and 2B are, respectively, a vertical axial cross sectional view of a conventional opposed-magnet magnetic circuit assembly with permanent magnets and a horizontal cross sectional view thereof as cut and viewed along the direction indicated by the arrows IIB—IIB in FIG. 2A.
Figure 2B:
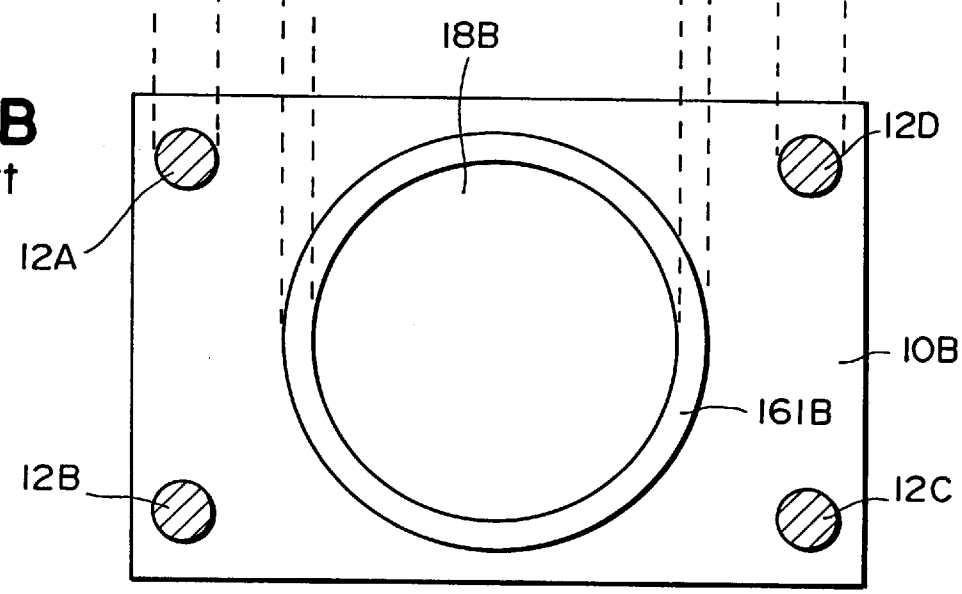
Figure 3:
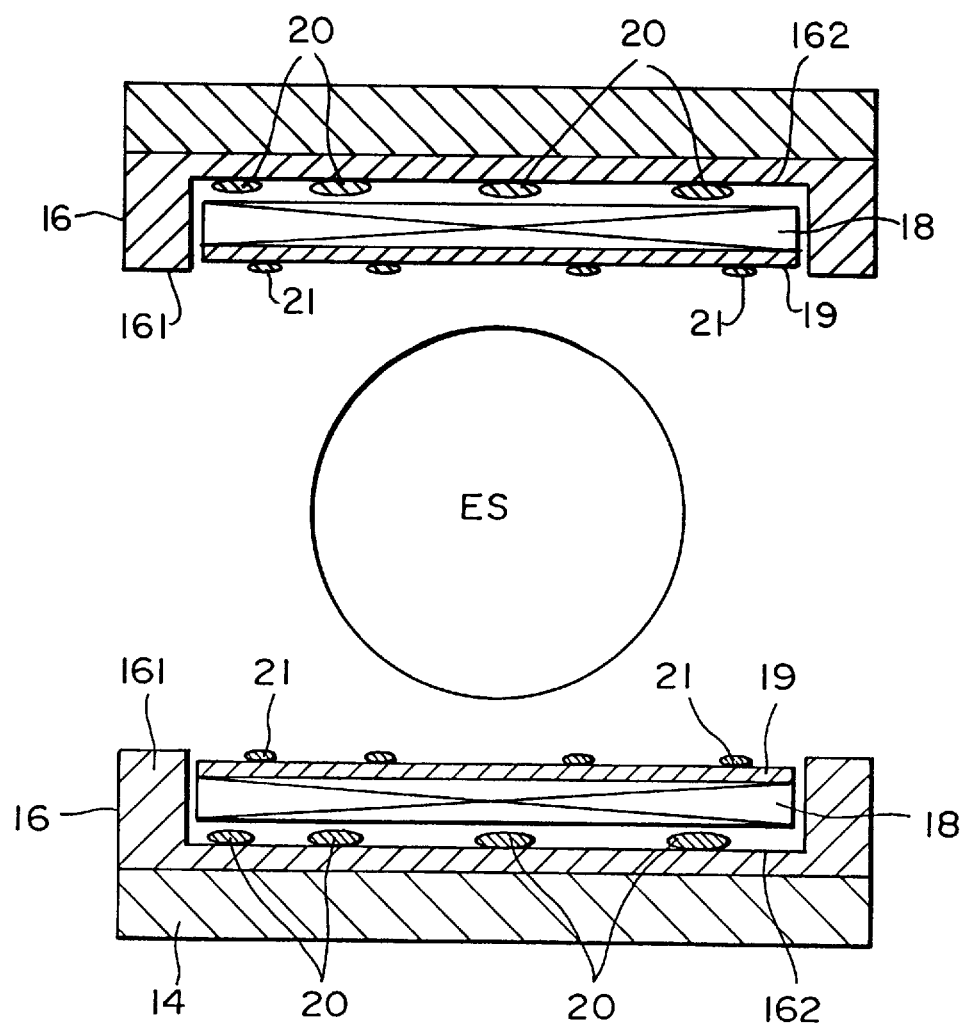
FIG. 3 is a vertical axial cross sectional view of the opposed-magnet magnetic circuit assembly with permanent magnets according to the first aspect of the present invention.

In the first place, detailed description is given of the improvement according to the first aspect of the invention, which relates to the uniformity of the working magnetic field in the evaluation space, by making reference to FIG. 3 of the accompanying drawings which is a vertical axial cross sectional view of the opposed-magnet magnetic circuit assembly with permanent magnets.

The above mentioned improvement relative to the uniformity of the working magnetic field is accomplished according to the invention by means of appropriate shimming. The field-adjustment plate 16 mounted on the surface of the permanent magnet 14 in FIG. 3 consists of a flat circular disk 162 and a circular projection 161, which serves as the primary shim, along the periphery of the flat disk 162. Though not shown in the figure, it is optional according to need to provide one or more of concentrical ringwise level differences to serve as the higher-order shims on the flat disk 162. A gradient coil 18 and a shimming plate 19 are installed within the space on the flat disk 162 of the field-adjustment plate 16 surrounded by the circular projection 161. In the prior art, it is usual that the combination of the gradient coil 18 and shimming plate 19 is directly bonded to the field-adjustment plate 16. Namely, it is the prior art that the shimming adjustment of the magnetic field is undertaken on the flat disk 162 of the field-adjustment plate 16.

On the other hand, the inventors have arrived at an idea to undertake the shimming adjustment on both of the field-adjustment plate 16 and the shimming plate 19 by bonding one or more of pieces of a magnet or a magnetic material, referred to as the first shim members 20 hereinafter, to the surface of the flat disk 162 of the field-adjustment plate 16 and one or more of pieces of a magnet or a magnetic material, referred to as the second shim members 21 hereinafter, to the surface of the shim plate 19.

To explain it in more detail, the first shim members 20 are bonded to the field-adjustment plate 16 or, mainly, to the flat disk 162 thereof and a combination of a gradient coil 18 and a non-magnetic shim plate 19, to which the second shim members 21 are bonded, is mounted thereon so as to effect fine shimming adjustment of uniformity of the magnetic field. The amount and bonding positions of the first and second shim members 20 and 21 can be selected empirically but it is usually selected by the aid of a numerical calculation. Since the flat disk 162 of the field-adjustment plate 16 is at a relatively large distance from the imaginary evaluation space indicated by the large circle ES in FIG. 3, the first shim members 20 bonded thereto have decreased influence on the distribution of the magnetic field but the influence extends over a relatively large range of the magnetic gap space., On the other hand, the second shim members 21 bonded to the shim plate 19 have a relatively great influence on the distribution of the magnetic field in the evaluation space ES because the shim plate 19 is bonded to the surface of the gradient coil 18 to face the evaluation space ES to be in more proximity to the evaluation space ES than the flat disk 162 of the field-adjustment plate 16 although the influence thereof is unavoidably more or less local due to the proximity to the evaluation space ES. Accordingly, it is a general guide principle to have the first shim members 20 on the flat disk 162 of the field-adjustment plate 16 playing a role for the rough adjustment by the use of relatively large pieces of a soft magnetic material or a magnet so as to improve the distribution of the magnetic field over a whole range of the evaluation space ES while the second shim members 21 on the shim plate 19 play a role for the fine adjustment of the magnetic field in local ranges within the evaluation space ES by the use of small pieces of a soft magnetic material or a magnet.

While the shim members 20 and 21 are made from a soft magnetic material or a magnet, it is preferable in order to facilitate adjustment of the magnetic field that the first shim members 20 are made from a magnet because the linearity can be maintained in the course of the shimming adjustment by conducting fine adjustment. Although soft magnetic materials can be used for the shim members 20, 21, it is important to ensure linearity of superposition when a plurality of shim members of a soft magnetic material are bonded. On the other hand, the second shim members 21 on the shim plate 19 are preferably made from a soft magnetic material each in a very small size in view of the requirement for the fine precision adjustment. Deviation from the linearity is small even by the use of a soft magnetic material therefor because the amount of shimming on the shim plate 19 is small.

It is a finding by the inventors that, while there would be a problem due to the disturbance of the linearity of the magnet material when the first shim members 20 of a magnet on the field-adjustment plate 16 are magnetically connected to the second shim members 21 of a soft magnetic material on the shim plate 19 as a possibility, no disturbance is caused in the linearity of the first shim members 20 of a magnet material on the field-adjustment plate 16 because the shim plate 19 is positioned to face the magnetic gap space apart from the flat disk 162 of the field-adjustment plate 16 and is isolated at a distance from the first shim members 20 of a magnet on the field adjustment plate 16. Accordingly, precision adjustment can be made by utilizing the correlation between the evaluation space and the shimming positions. It should be noted, however, that undesirable non-linearity as is mentioned before is caused when both of them are coexistent on one and the same plane.

Although the first shim members 20 made from a magnet material can be bonded to the field-adjustment plate 16 by means of the attractive force of the magnet per se, it is preferable that bonding therebetween is effected by the use of an adhesive or by screwing in order to prevent possible displacement of the shim members 20 by vibrations or mechanical shocks. The second shim members 21 of a soft magnetic material, on the other hand, are necessarily bonded to the shim plate 19 by the use of an adhesive or by screwing since otherwise they are readily displaced. The shim members 21 made from a soft magnetic material are preferably in the form of a thin sheet having openings for screw bonding. As to the size and shape of the shim members 21, it is a possible to use a plurality of various members differing in different respects in combination but it is easier and more reliable to have a plural number of the members having one and the same size and shape, which are used in different numbers according to the object of the adjustment. While it is possible to use several flat members in lamination by putting one on the other, it is preferable in order to improve the linearity by the lamination of a plurality of members that the lamination is conducted vertically in such a fashion that the lengthwise direction of the members made from a soft magnetic material is in coincidence with the direction of the magnetic field generated by the permanent magnets.

As is mentioned before, the soft magnetic material for the second shim members 21 is selected from iron and iron-based alloys, nickel and nickel-based alloys and amorphous soft magnetic materials. When precision in fine adjustment is desired, the magnetic material should be selected from those having a small saturation magnetization and good workability in mechanical fabrication into thin and tiny pieces. For example, nickel or a nickel-based alloy such as Permalloy is suitable as a soft magnetic material for the shim members because the saturation magnetization thereof does not exceed 7000 G and the workability thereof into a thin sheet is good by undertaking rolling works. Cobalt-based amorphous magnetic materials in the form of a thin belt can also be used for the purpose by virtue of their relatively low saturation magnetization and good workability into a thin sheet having a thickness of 20 to 30 $\mu$m.

The flat magnet to serve as the shim members 20 on the field-adjustment plate 16 can be made from a ferrite magnet or rare earth-based magnet which can be either a sintered magnet or a bonded magnet. Different from the second shim members 21 made from a soft magnetic material, it is sometimes advantageous to prepare the shim members 20 of several different sizes and they are used in an appropriate combination depending on the desired amount of adjustment of the magnetic field because the role played thereby is a relatively large and rough adjustment of the magnetic field.

The shim plate 19 can be made from a polymeric material such as a polyvinyl chloride resin and thermosetting phenolic resin. Metallic materials should be avoided for this purpose due to occurrence of eddy currents as a consequence of the electromagnetic induction by the gradient coil 18.

The shimming adjustment of the magnetic field as the subject matter of the present invention in the first aspect is under-taken with a purpose of fine adjustment of the magnetic field. The shimming adjustment can be preceded by mechanical adjustment by which uniformity of the magnetic field can be accomplished grossly to give a uniformity of, for example, 200 ppm to 400 ppm established in an evaluation space ES having an imaginary spherical extension of 400 mm diameter.

It is of course important in order to further improve the uniformity of the magnetic field to appropriately select the amounts and positions of the shim members made from a magnet or a soft magnetic material, which selection can be made empirically or by experimentation. Since the requirement for the uniformity of the magnetic field is 50 ppm or smaller or, desirably, 10 ppm or smaller in a magnetic field of 2000 Oe, for example, corresponding to only 0.1 Oe or smaller in an absolute value or only a few tenths or smaller of the geomagnetism. Therefore, it is usually a very difficult matter to accomplish the above mentioned uniformity of the magnetic field empirically or by experimentation alone without the aid of computerized calculation.

The computerized calculation can be performed in several different ways such as the method of mathematical programming, method of linear programming, method of seven planes and the like, of which the method of linear programming is particularly suitable for the shimming adjustment according to the present invention since an optimum solution can be obtained by a relatively small amount of calculation if the difference between the initial value and the target value is not so large, for example, within two orders.

Following is a description of the present invention according to the second aspect of the invention. As is mentioned before, the other of the problems to be solved by the present invention is alleviation of the oppressive sense received by a patient lying in an MRI instrument using an opposed-magnet magnetic circuit assembly as a consequence of the encaved condition of the patient because the conventional magnetic circuit assembly is constructed by using two connecting yokes standing on both sides of the patient, each of which is in the form of a plate having such a large width as not to cause saturation magnetization with the magnetic fluxes and to provide full mechanical support of the upper and lower permanent magnets.

The opposed-magnet magnetic circuit assembly, by which the above mentioned disadvantages and problems in the prior art assembly can be overcome, is illustrated in detail by making reference to FIGS. 4A, 4B and 4C of the accompanying drawing, which are a plan view, a front elevational view as viewed in the lying direction of a patient in the MRI instrument, referred to as the lengthwise direction hereinafter, and a side elevational view as viewed in the direction perpendicular to the lying direction of a patient's body, referred to as the transverse direction hereinafter, respectively.

As is shown in the figures, the magnetic circuit assembly has two connecting yokes 108, 109 each in the form of a column having a rectangular cross section, by which the upper and lower symmetrical sets each consisting of a back yoke 110 or 115, permanent magnet 111 or 114 and field-adjustment plate 112 or 113, respectively, are connected together both mechanically and magnetically to form a magnetic-field gap space 116 therebetween as assembled by means of the screw bolts 117 and 118.

Figure 4A:
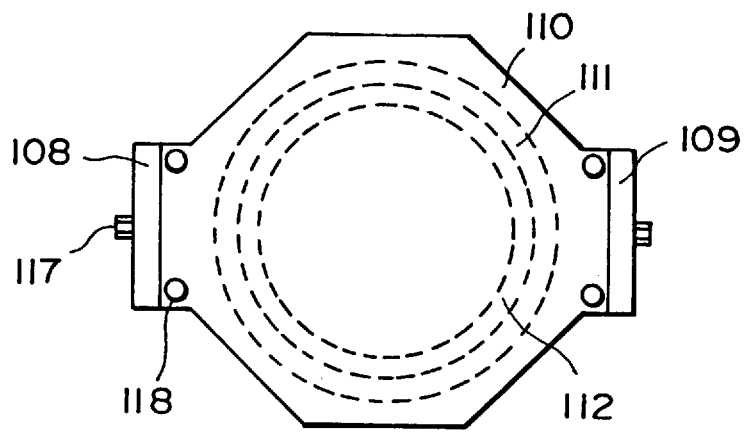
FIGS. 4A, 4B and 4C are a plan view, a front elevational view and a side elevational view, respectively, of the opposed-magnet magnetic circuit assembly with permanent magnets according to the second aspect of the present invention.
Figure 4B:
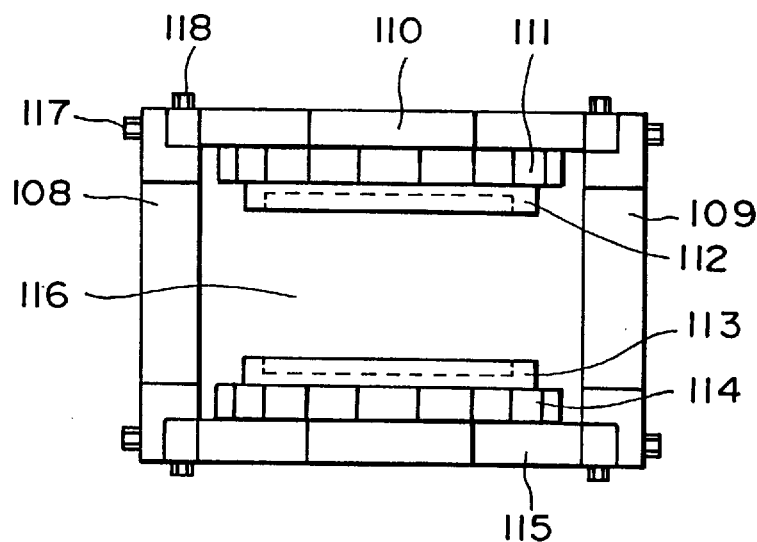
Figure 4C:
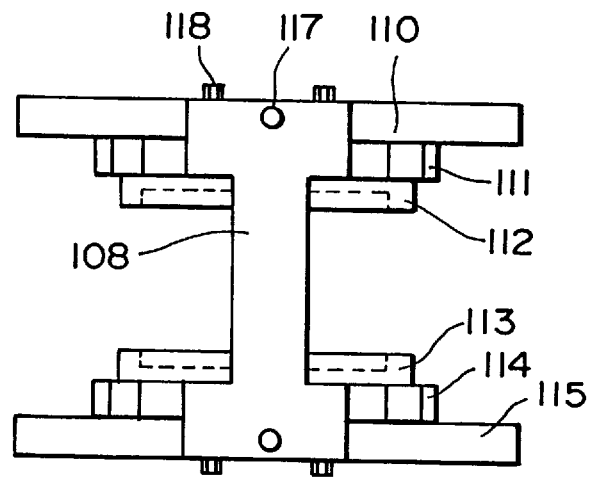

As is understood from FIG. 4C, the width of each of the connecting yokes 108 and 109 along the lengthwise direction is larger in the upper and lower end portions than in the center portion thus in an H-wise configuration although the configuration of the connecting yokes 108, 109 is not limited to an H-wise configuration but can be a form having tapered or smoothly curved contours. The width of the columnar connecting yokes in the end portions must be large enough so as to support the structure with mechanical stability while the width thereof in the center portion must be small in order to ensure lateral openness on both sides of the patient lying in the MRI instrument not to give a claustrophobic feeling to the patient since the view field of the patient lying along the middle height in the space 116 is never restricted by the upper and lower end portions of the columnar connecting yokes 108 and 109. As understood from FIGS. 4B and 4C, each of the connecting yokes 108, 109 constitutes a single integral member. Monitoring of the patient from outside can also be facilitated by this means.

Although the width or cross sectional area of the columnar connecting yokes 108 and 109 should be small enough from the standpoint of ensuring lateral openness, the lower limit thereof should be selected in consideration of the problem of necessary magnetic shielding due to an unduly large leakage of the magnetic fluxes passing therethrough between the permanent magnets 111, 114 and in consideration of the mechanical strength thereof to withstand the large attractive force between the upper and lower permanent magnets 111 and 114 although the major factor to be taken into account is leakage of the magnetic flux because the mechanical strength of the columnar connecting yokes 108, 109 is usually large enough as compared with the attractive force of the permanent magnets 111, 114. In this regard, measurement of the magnetic field on the surface of the connecting yokes 108, 109 provides a guide for the appropriate selection of the cross sectional area of the connecting yokes 108, 109 in the center portion according to a criterion that the magnetic field on the surface of the connecting yokes 108, 109 should be 10 Oe or lower. When the magnetic field due to leakage of the magnetic flux exceeds 10 Oe on the surface of the connecting yokes 108, 109, an undue expansion is caused in the space around the magnetic circuit assembly in which the magnetic field due to magnetic leakage exceeds 5 Oe as the permissible upper limit of the magnetic field by leakage around an MRI instrument resulting in an increase of the costs for an elaborate magnetic shielding means or for the construction of a magnetically shielded room for the installation of the MRI instrument.

As is shown in FIG. 4A, each of the upper and lower back yokes 110 and 115 is in a generally octagonal form and the laterally opposite two sides thereof are each connected to the end portion of the connecting yoke 108 or 109 by the screw bolts 117, 118. The configuration of the back yokes is not limited to octagonal as illustrated in FIG. 4A but can be hexagonal or polygonal in general excepting trigonal, tetragonal and pentagonal configurations. Although tetragonal back yokes have no particular disadvantages from the standpoint of the magnetic efficiency alone, tetragonal back yokes are disadvantageous because the corner portions thereof do not contribute to the conduction of the magnetic fluxes through the back yokes but rather contribute to an increase in the weight of the back yokes and increased restriction of the patient's view field in the upward direction.

The aspect ratio of each of the permanent magnets 111 and 114, i.e. the ratio of the length thereof in the lengthwise direction (i.e. length) to the length in the transverse direction (i.e. With), should be in the range from 1:2 to 2:1 or, preferably, from 1:2 to 1:1 in consideration of the balance between the increase in the lateral openness and increase in the weight of the back yokes 108, 109 when the transverse length of the permanent magnets 111, 114 is increased.

The upper magnetic structure consisting of the upper field-adjustment plate 112, upper permanent magnet 111 and upper back yoke 110 is mounted on and supported by the two columnar connecting yokes 108 and 109 as being connected by means of the screw bolts 117. The connecting screw bolts 117 need not be so large because the geometrical stability of the assemblage between the upper magnetic structure and the connecting yokes 108, 109 is ensured also by the magnetic attractive force therebetween without the risk of demounting of the upper magnetic structure from the connecting yokes 108, 109. The screw bolts 118 in the upper back yoke 110 serve also for the purpose of fine adjustment of the magnetic field in the magnetic-field gap space 116 by modifying the distance between the upper and lower magnetic structures or by modifying the angle of inclination of the magnetic structure in the lengthwise and/or transverse directions.

As in the embodiments according to the first aspect of the invention, the permanent magnets 111, 114 can be made from hard ferrite magnets or rare earth-based magnets, of which sintered rare earth-based magnets of a samarium-cobalt or neodymium-iron-boron alloy are preferred in respect of the high performance thereof to the ferrite magnets with which a magnetic field of 1000 Oe or higher can hardly be obtained without unduly increasing the weight of the magnets. In particular, the neodymium-iron-boron magnets are the most preferable because they can exhibit high magnetic performance and have high mechanical strengths as compared with the samarium-cobalt magnets.

The material of the field-adjustment plates 112, 113 can be selected from soft magnetic materials such as iron, silicon steels, soft ferrites, resin-bonded irons, amorphous magnetic materials and the like either as a single material or as a composite thereof. The configuration of the field-adjustment plates is a generally circular or elliptic plate having a downwardly or upwardly protruded circular projection along the periphery of the circular or elliptic plate. This peripheral projection has an effect to improve the uniformity of the magnetic field in the imaginary evaluation space ES.

The material of the yokes is preferably an iron-based material having a high saturation magnetization and low coercive force in order to minimize the loss in the magnetomotive force. For example, the materials of the grades S400 and SMB specified in JIS (Japanese Industrial Standard) are preferable in respect of the balance between the magnetic properties and the costs. The material of the grade SUY is excellent in the magnetic properties.

What is claimed is:

1. In an opposed-magnet magnetic circuit assembly with permanent magnets comprising a pair of permanent magnets oppositely facing up and down each to the other keeping a magneticfield gap space therebetween, a pair of field-adjustment plates each consisting of a flat disk and a circular projection along the periphery of the flat disk and mounted on the surface of the permanent magnet to face the magnetic-field gap space, a pair of combinations of a gradient coil and a shimming plate each mounted below or above the flat disk of the field-adjustment plate keeping a space therewith and a set of yokes magnetically connecting the permanent magnets to form a closed magnetic circuit, the improvement which comprises:

(a) bonding at least one member of a magnet material or a soft magnetic material to the surface of the flat disk of each of the field-adjustment plates;

(b) mounting each of the shimming plates on the surface of the gradient coil to face the magnetic-field gap space; and (c) bonding at least one member of a magnet material or a soft magnetic material to the surface of the shimming plate facing the magnetic-field gap space.

2. The improvement as claimed in claim 1 in which the member bonded to the surface of the flat disk of each of the field-adjustment plates is made from a magnet material and the member bonded to the surface of the shimming plate facing the magnetic-field gap space is made from a soft magnetic material.

* * * * *